US006592317B1

United States Patent
Rush et al.

(10) Patent No.: US 6,592,317 B1
(45) Date of Patent: Jul. 15, 2003

(54) POD LOADER INTERFACE END EFFECTORS

(75) Inventors: John M. Rush, Mountain View; Torben Ulander, Sunnyvale, both of CA (US)

(73) Assignee: Asyst Technologies, Inc., Fremont, CA (US)

( * ) Notice: Subject to any disclaimer, the term of this patent is extended or adjusted under 35 U.S.C. 154(b) by 72 days.

(21) Appl. No.: 09/593,245

(22) Filed: Jun. 13, 2000

Related U.S. Application Data

(63) Continuation-in-part of application No. 09/343,110, filed on Jun. 29, 1999, now Pat. No. 6,086,323, which is a continuation of application No. 08/400,039, filed on Mar. 7, 1995, now Pat. No. 5,984,610.

(51) Int. Cl.[7] ............................................. B65G 1/133
(52) U.S. Cl. ..................................... 414/217; 294/67.31
(58) Field of Search ................................ 414/217, 940, 414/941; 294/67.31, 86, 106

(56) References Cited

U.S. PATENT DOCUMENTS 4,530,636 A * 7/1985 Inaba et al. ................. 414/730
4,936,734 A * 6/1990 Osada ........................ 414/621
5,203,445 A * 4/1993 Shiraiwa .................. 198/464.3
5,284,412 A * 2/1994 Shiraiwa et al. ............ 414/217

FOREIGN PATENT DOCUMENTS

JP          1-155640         * 1/1989       ........... H01L/21/68

* cited by examiner

Primary Examiner—Christopher P. Ellis
Assistant Examiner—Kenneth W Bower
(74) Attorney, Agent, or Firm—O'Melveny & Myers LLP

(57) ABSTRACT

An end effector for a pod loader interface includes a gripper plate that attaches to the articulated arm. A pair of gripper blades are separated from each other along and are coupled to the gripper plate. During gripping of a wafer carrier, the gripper blades initially close toward each other and then draw nearer to the gripper plate. Nested outer and inner U-shaped yokes, which may attach the gripper plate to the articulated arm, are joined by rotational joints to permit their relative rotation for reorienting the wafer carrier. Yet other aspect of the present invention are a mechanical forearm drive that provides substantially linear motion of an articulated arm's wrist joint, and an end effector rotary-drive included in a forearm of the articulated arm.

39 Claims, 10 Drawing Sheets

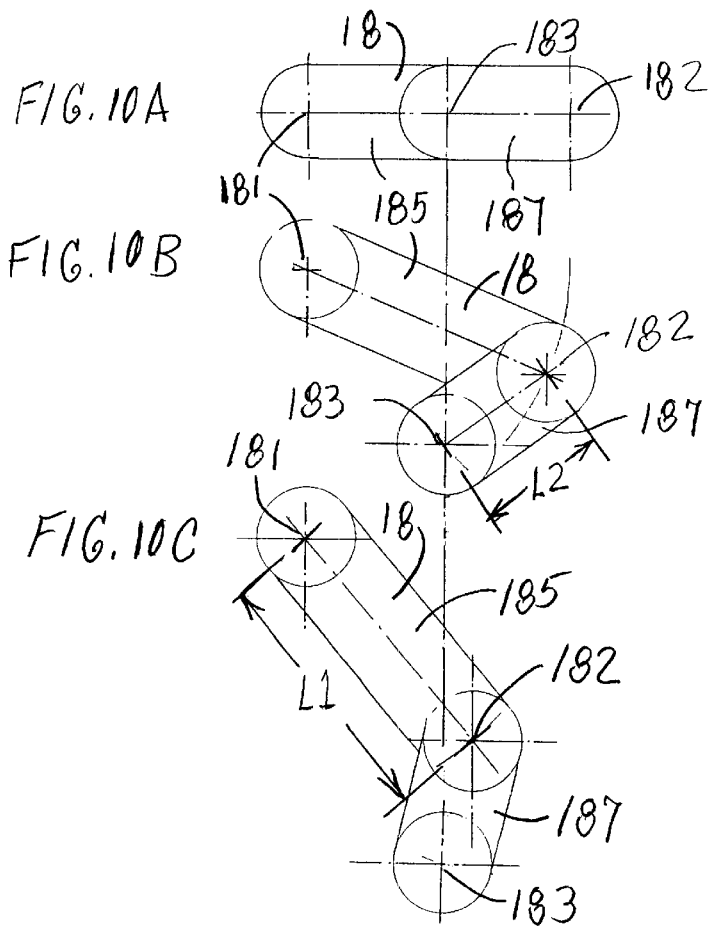
FIG. 10A
FIG. 10B
FIG. 10C
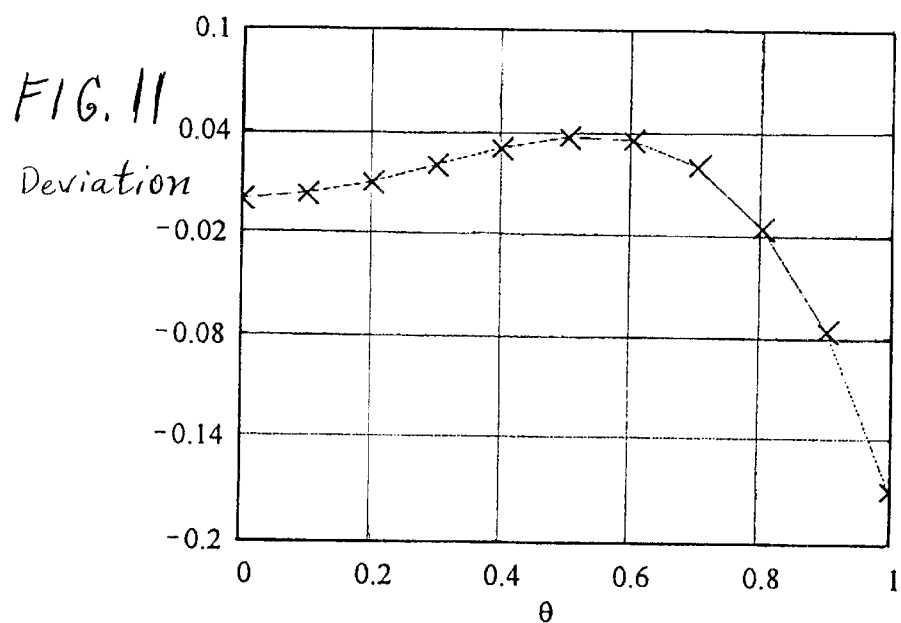
FIG. 11

POD LOADER INTERFACE END EFFECTORS

CROSS REFERENCE TO RELATED APPLICATIONS

This is a continuation-in-part of application Ser. No. 09/343,110 that was filed Jun. 29, 1999, which issued Jul. 11, 2000, as U.S. Pat. No. 6,086,323, that is a continuation of application Ser. No. 08/400,039 filed Mar. 7, 1995, which issued Nov. 16, 1999, as U.S. Pat. No. 5,984,610.

BACKGROUND OF THE INVENTION

1. Field of the Invention

The present invention relates generally to silicon wafer handling machines, and more particularly is a pod loader interface that is adapted to unload and reload SMIF (Standard Mechanical InterFace) pods.

2. Description of the Prior Art

Handling of silicon wafers is critical to the integrated circuit (IC) manufacturing process. Any physical damage to the wafers will, of course, decrease the chip yield, which is a prime consideration in the profitability of semiconductor manufacturing. Contamination of the wafer by particulate or other contaminants also decrease chip yield. For several decades the semiconductor manufacturing industry has addressed its need to reduce contamination during manufacturing by replacing human operators, as much as practicable, with robot wafer handling equipment.

The desire to shield wafers from contaminants has led the semiconductor industry to the development and use of SMIF pods. SMIF pods allow wafers to be transported in a clean, sealed environment, so they are not exposed to ambient air.

Once the SMIF pods reach their destination, they must be opened, and the wafer carrier inside must be placed in position for the desired process operation. If the unloading and positioning operation is performed manually, the wafers are subjected to the usual risk of damage from mishandling as well as increased exposure to contamination.

Pod loader interfaces are used extensively in the semiconductor industry to automatically unload a SMIF pod and position the wafers held in a wafer carrier for the next process operation, and then reload the wafers and the wafer carrier when the process step is completed. In general, these pod loader interfaces include an arm for transporting the wafer carrier and wafers between a clean mini-environment established within the pod loader interface and the processing tool which performs the process step. The arm of the pod loader interface includes an end effector that grasps and secures the wafer carrier.

One difficulty experienced in integrating a pod loader interface with a semiconductor processing tool is mechanically aligning the interface and the tool so the end effector may reliably grasp and secure a wafer carrier present within the processing tool and/or pod loader interface. It is also advantageous if a pod loader interface can be readily adapted to deliver wafer carriers to semiconductor processing tools in any arbitrarily chosen orientation.

BRIEF SUMMARY OF THE INVENTION

Accordingly, it is an object of the present invention to provide a means to more reliably automatically open and unload, and subsequently reload and close, a SMIF pod.

Another object of the present invention is to provide an end effector for an arm of a pod loader interface that relaxes alignment tolerances between the pod loader interface and the semiconductor processing tool.

Yet another object of the present invention is to provide an end effector for an arm included in a pod loader interface that readily accommodates varying positions for wafer carriers in semiconductor processing tools.

Briefly, the present invention in one aspect is an end effector for a pod loader interface that automatically opens a SMIF pod and unloads the contents thereof. The pod loader interface includes an elevator that raises a SMIF pod cover away from a SMIF pod base to reveal the wafer carrier contained within the sealed SMIF pod. An articulated arm of the pod loader interface thereafter reaches through an opening in a bulkhead thereof, secures the wafer carrier and withdraws it through the bulkhead opening. The wafer carrier is then placed at a location within the processing tool where it can be operated upon by the processing tool to perform a step in the manufacturing process. The pod loader interface includes an integrated clean air system to maintain the wafers in a clean environment.

A specific aspect if the present invention is an end effector, attached to the articulated arm of the pod loader interface, that grips the wafer carrier. This end effector includes a gripper plate that attaches to the articulated arm. Aligning means secured to the gripper plate properly align the end effector with the wafer carrier. A pair of gripper blades are separated from each other along and are coupled to the gripper plate. During gripping of the wafer carrier by this end effector, the gripper blades initially close toward each other and then draw nearer to the gripper plate. The end effector also includes drive means, that is secured to the gripper plate, which energize movement of the gripper blades for gripping the wafer carrier. By drawing the gripper blades nearer to the gripper plate, this end effector accommodates greater variations among wafer carrier positions both within the pod loader interface and within the processing tool.

Another aspect of the present invention is an end effector which also includes an outer and an inner nested pair of U-shaped yokes which attach the gripper plate to the articulated arm. Each of the U-shaped yokes has a base from opposite ends of which extend two parallel sides. The base of the outer U-shaped yoke attaches directly to the articulated arm. To permit relative rotation of the U-shaped yokes with respect to each other, the outer and inner U-shaped yokes are joined by rotational joints located at ends of each of the sides furthest from their bases. The gripper plate, preferably that described in the preceding paragraph, is fastened to the base of the inner U-shaped yoke between the sides thereof. This end effector also includes a carrier rotary-drive that is coupled between the U-shaped yokes to energizes rotation of the outer and inner U-shaped yokes with respect to each other. In this way, the end effector may rotate a wafer carrier that is gripped by the gripper blades about an axis that:

1. passes through the rotational joints between ends of the sides of the U-shaped yokes; and
2. is oriented parallel to semiconductor wafers held in the wafer carrier.

Yet another aspect of the present invention is an improved mechanical rotary drive for a forearm of the articulated arm. In this improved rotary drive, a notched belt, formed into a continuous loop and tensed by a differential screw that joins ends of the belt, couples together pulleys that are located at the shoulder and elbow joints of the articulated arm. Respective diameters of the pulleys and lengths of the upper arm and forearm are arranged so rotation of the upper arm about the shoulder joint effects substantially straight line motion of the wrist joint during transportation of the wafer carrier.

Yet another aspect of the present invention is an end effector rotary-drive included in a forearm of the articulated arm. The end effector rotary-drive is coupled through a wrist joint of the forearm to the gripper plate of the end effector. In this way, the end effector rotary-drive can independently rotate the gripper plate with respect to the forearm about an axis that is oriented perpendicular to a plane in which the wrist joint moves when the articulated arm transports semiconductor wafers held in the wafer carrier to or from the processing tool.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIGS. 10A–10C are plan views which schematically illustrate extension of the articulated arm depicted in FIG. 9 from a home position;

FIG. 11 is a graph showing deviation from straight line motion exhibited by a wrist joint of the articulated arm depicted in FIG. 9.

DETAILED DESCRIPTION

Figure 1:
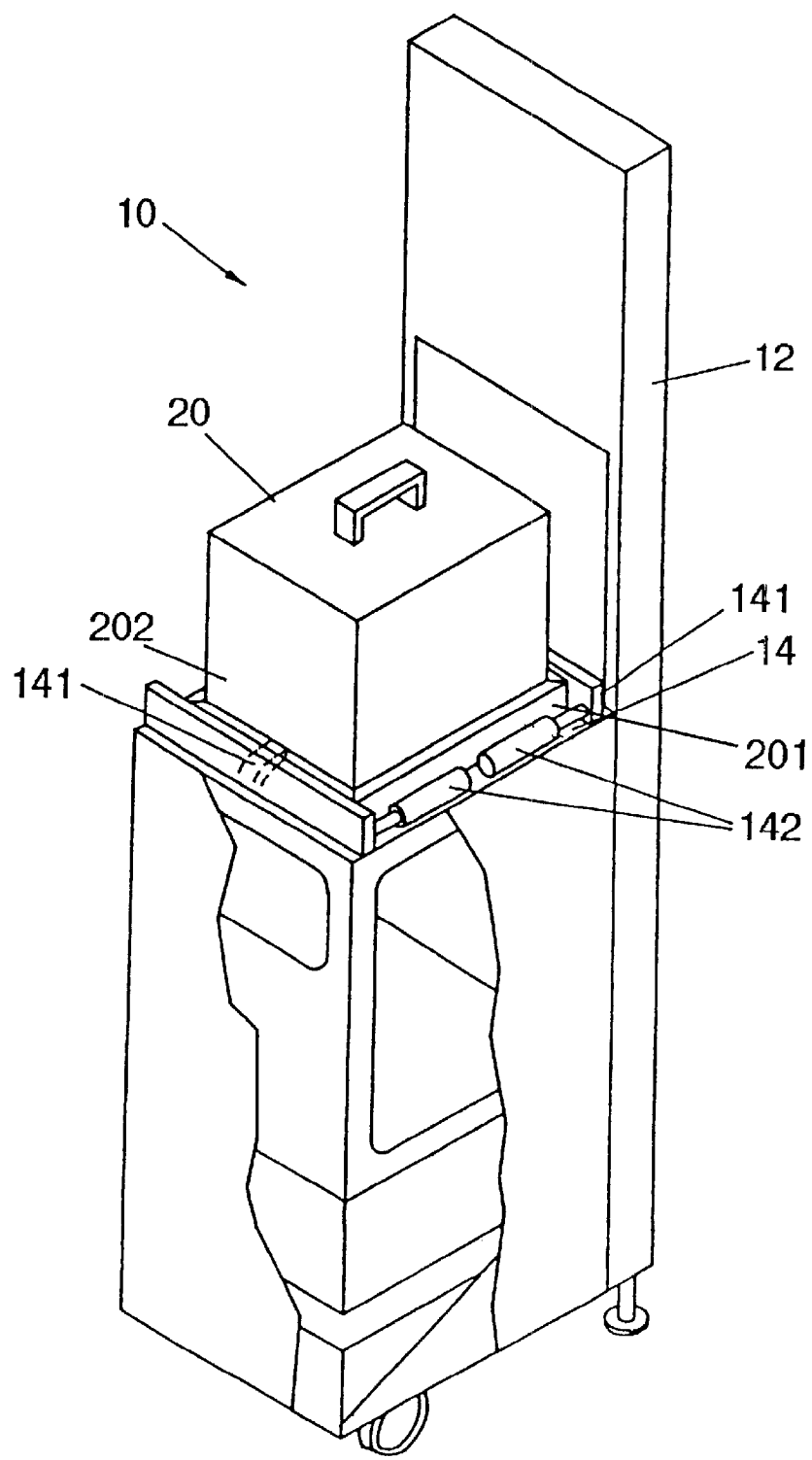
FIG. 1 is a front perspective view of the pod loader interface in accordance with the present invention.
Figure 2:
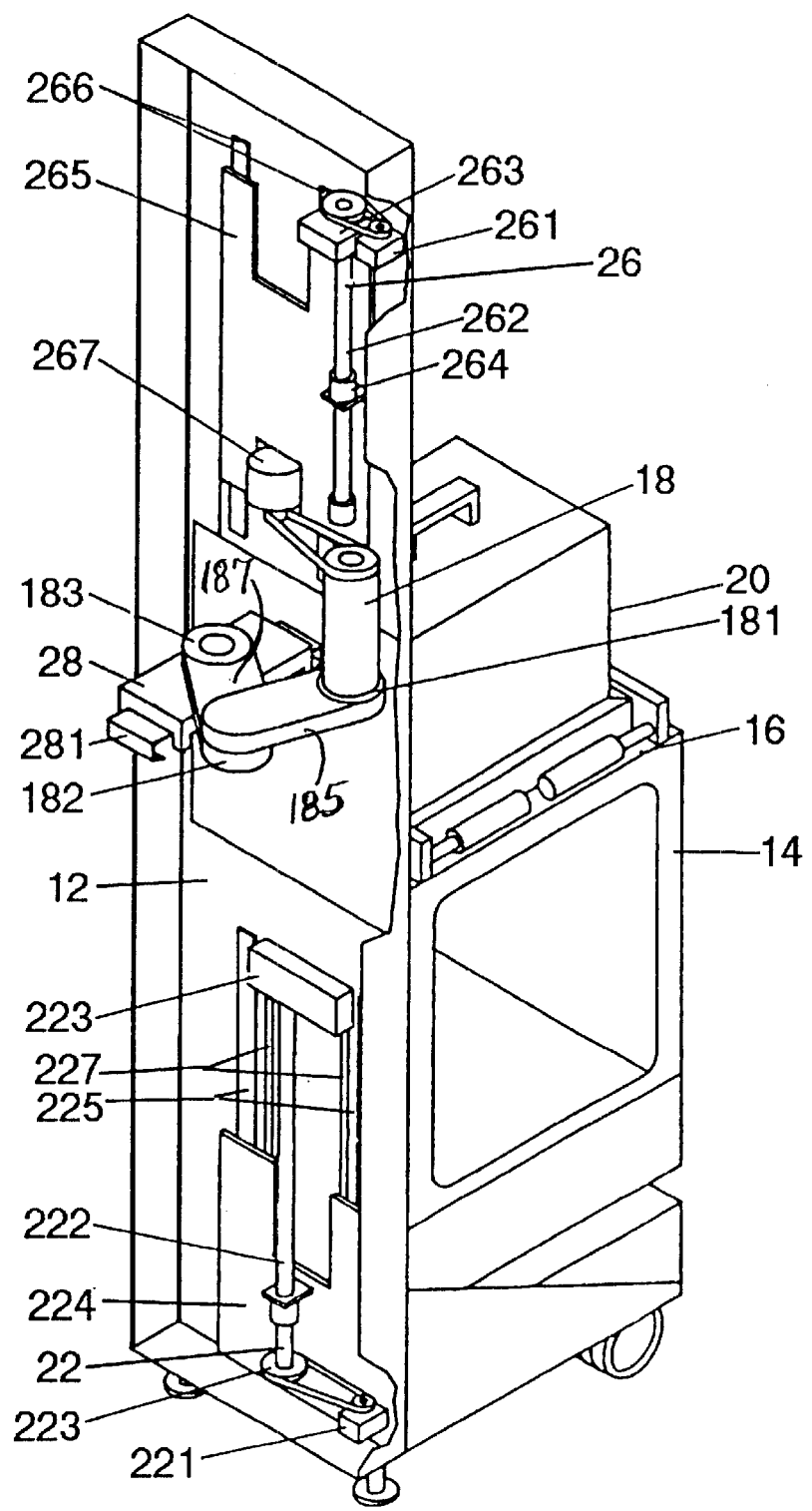
FIG. 2 is a rear perspective view of the pod loader interface in accordance with the present invention.
Figure 3:
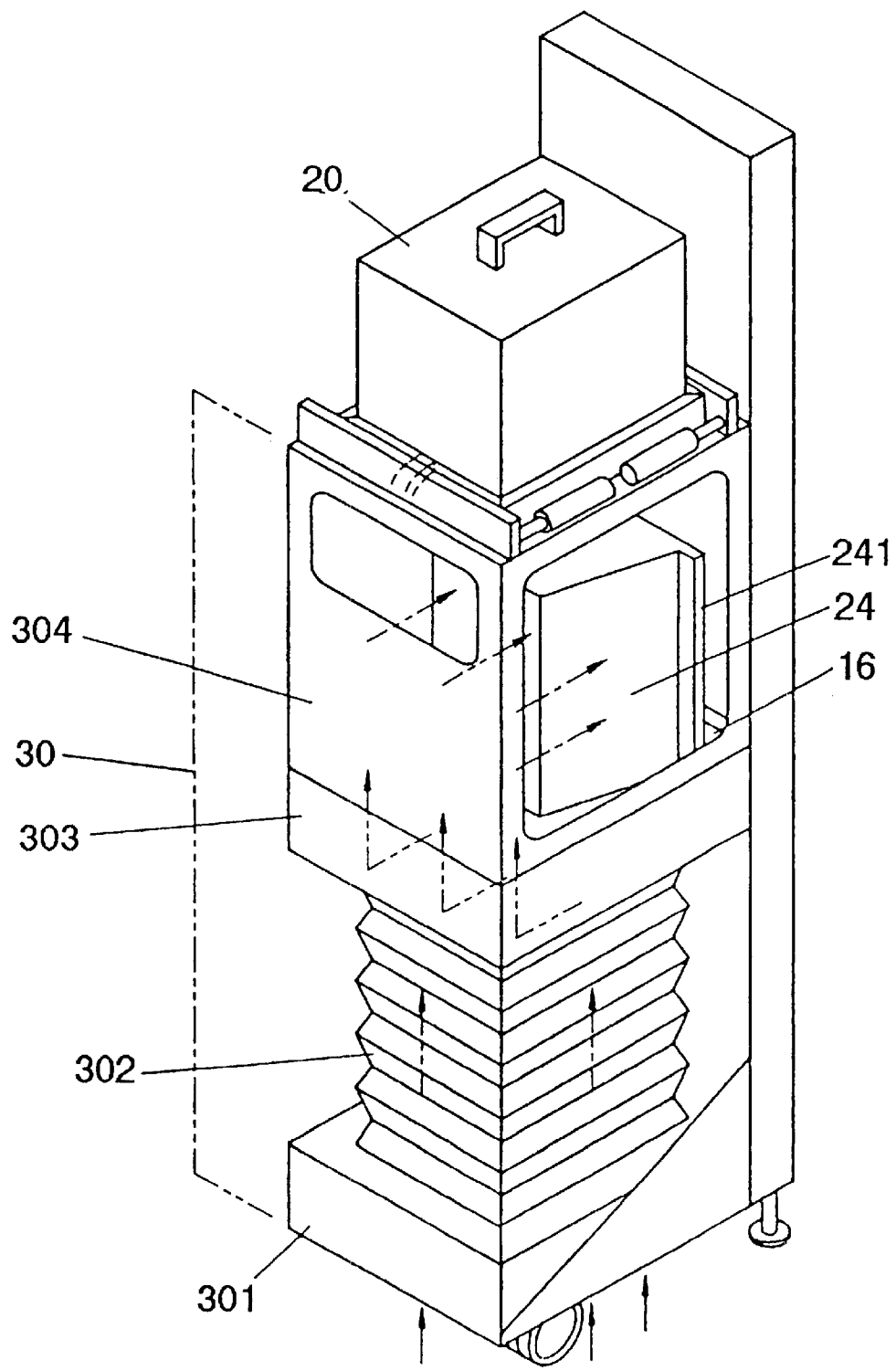
FIG. 3 is a front perspective view of the pod loader interface in accordance with the present invention in a raised position.

The present invention is a pod loader interface 10. Referring now to FIGS. 1 through 3, it can be seen that the machine comprises a supporting bulkhead 12, an elevator 14, a loading platform 16, and an articulated arm 18. The loading platform 16 is adapted to receive a SMIF pod 20. An unlocking mechanism is contained in the loading platform 16 to release the mechanism locking a base 201 to the cover 202 of the SMIF pod 20. Means to perform the unlocking procedure are well known in the art, and thus are not described in detail herein or illustrated in the drawings.

The elevator 14 is the means used to remove the cover 202 from the SMIF pod 20. Clamps 141, that in a prior configuration of the pod loader interface 10 were controlled by air cylinders 142, are used to secure the SMIF pod 20 in position on the elevator 14 before the elevator 14 is raised to open the SMIF pod 20. In the presently preferred configuration of the pod loader interface 10, electric actuators control the clamps 141.

An elevator drive mechanism 22 raises and lowers the elevator 14. The elevator drive mechanism 22 includes a motor 221 which turns, via a belt-and-pulley linkage, a lead screw 222. The lead screw 222 is affixed via two mounting blocks 223 to the bulkhead 12. In a prior configuration of the pod loader interface 10, an elevator carriage 224 travels up and down along two guide rails 225. In this prior configuration, the carriage 224 is affixed to the elevator 14 by two connecting arms. The connecting arms slide along slots 227 in the rear of the bulkhead 12, allowing the elevator 14 to be raised and lowered. In the presently preferred configuration of the pod loader interface 10, the elevator carriage 224 travels up and down along a single guide rail, and the motor 221 is a stepper motor that employs closed-loop feedback.

The articulated arm 18 is the means used to grasp and move a wafer carrier 24 contained within the SMIF pod 20. The arm 18 includes pivoting shoulder 181, elbow 182, and wrist 183 joints to allow a complete range of motion in the horizontal direction. The arm 18 includes an upper arm 185 which extends between the shoulder joint 181 and the elbow joint 182, and a forearm 187 which extends between the elbow joint 182 and the wrist joint 183.

An arm vertical drive 26 permits the arm 18 to raise and lower the wafer carrier 24 vertically. The vertical drive 26 includes a second motor 261 which turns, via a belt-and-pulley linkage, a lead screw 262. The lead screw 262 is affixed to the bulkhead 12 via a mounting block 263. A bearing assembly 264 affixed to an arm carriage 265 allows the lead screw 262 to drive the arm carriage 265 up and down. In a prior configuration of the pod loader interface 10, the arm carriage 265 travels up and down along two guide rails 266. The arm carriage 265 is affixed to an upper end of the articulated arm 18, so that the arm 18 moves up and down with the carriage 265. In the presently preferred configuration of the pod loader interface 10, the arm carriage 265 travels up and down along a single guide rail, and the second motor 261 is a stepper motor that employs closed-loop feedback.

The arm carriage 265 also supports a third motor 267 which provides the impetus for the horizontal travel means of the articulated arm 18. The third motor 267 also uses a belt-and-pulley linkage to transmit rotational force to the arm 18. In the presently preferred configuration of the pod loader interface 10, the third motor 267 is also a stepper motor that employs closed-loop feedback.

An end effector 28 affixed to an end of the arm 18 allows the machine to grasp and secure the wafer carrier 24. In the prior configuration of the pod loader interface 10, the gripping means 281 are extended and retracted by air cylinders.

Figure 4:
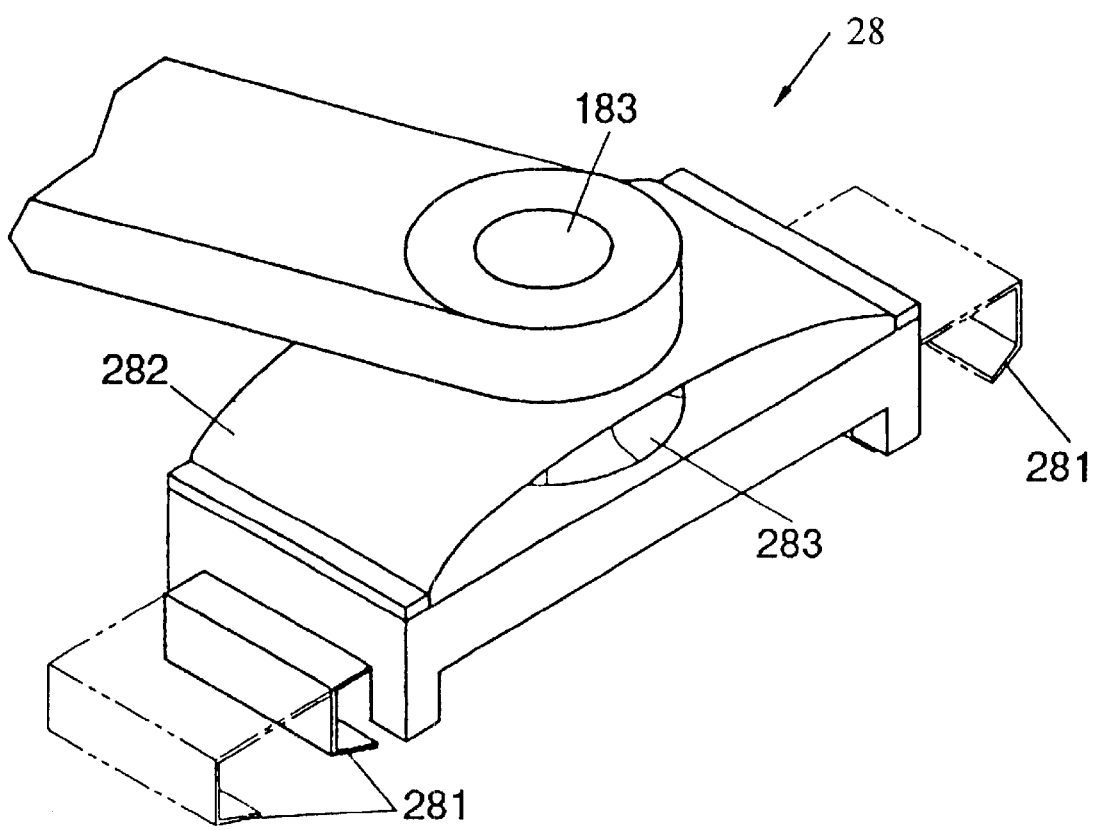
FIG. 4 is a perspective view of an prior configuration for an end effector used in the pod loader interface.
Figure 5:
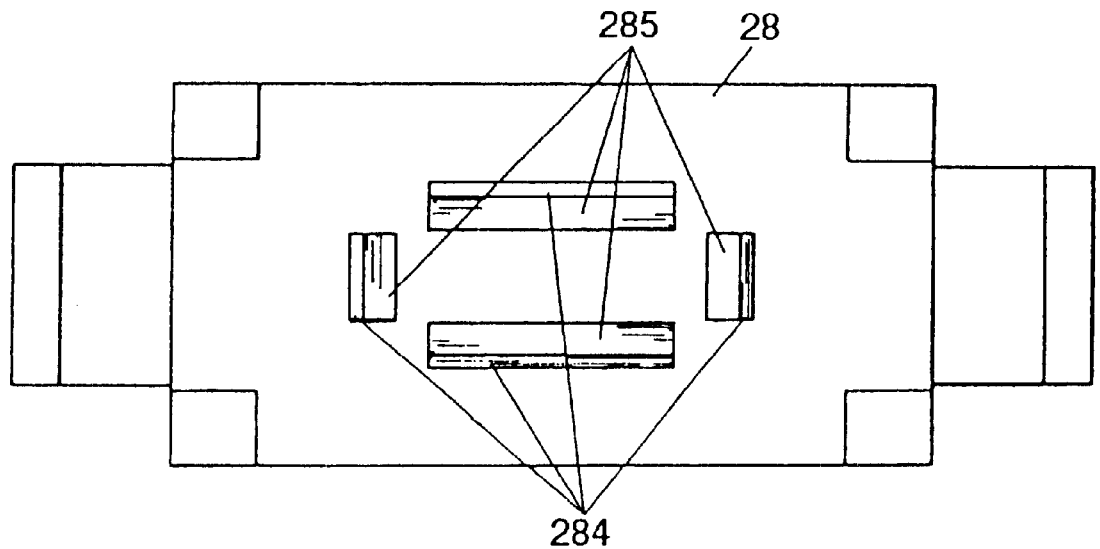
FIG. 5 is an underside view of the prior configuration end effector depicted in FIG. 4.

FIGS. 4 and 5 depict in greater detail a prior configuration for the end effector 28. The open position of the gripping means 281 of this prior configuration is shown in phantom in FIG. 4. This prior configuration of the pod loader interface 10 attaches the end effector 28 to the articulated arm 18 by a leaf spring assembly 282. A sensing means 283 installed on an upper surface of the end effector 28 permits the pod loader interface 10 to determine when the end effector 28 contacts the wafer carrier 24. In the prior configuration of the pod loader interface 10, the sensing means 283 is a thin film piezoelectric sensor.

FIG. 5 shows the aligning means 284 installed on an underside of the end effector 28. The aligning means 284 in the preferred embodiment is a set of four blocks situated around a center point. The blocks each have a tapered inner side surface 285 that creates a funneling means to guide the handle (not shown) on the wafer carrier to a centered position with respect to the end effector 28. If the alignment of the handle, and hence the carrier, is not perfectly centered when the end effector 28 is pushed onto it, the guide blocks direct the carrier into an exactly centered position. Precise details of the arrangement for the blocks and the tapered inner surface 285 vary depending upon the specific type of wafer carrier 24 with which they are adapted to mate.

Figure 6:
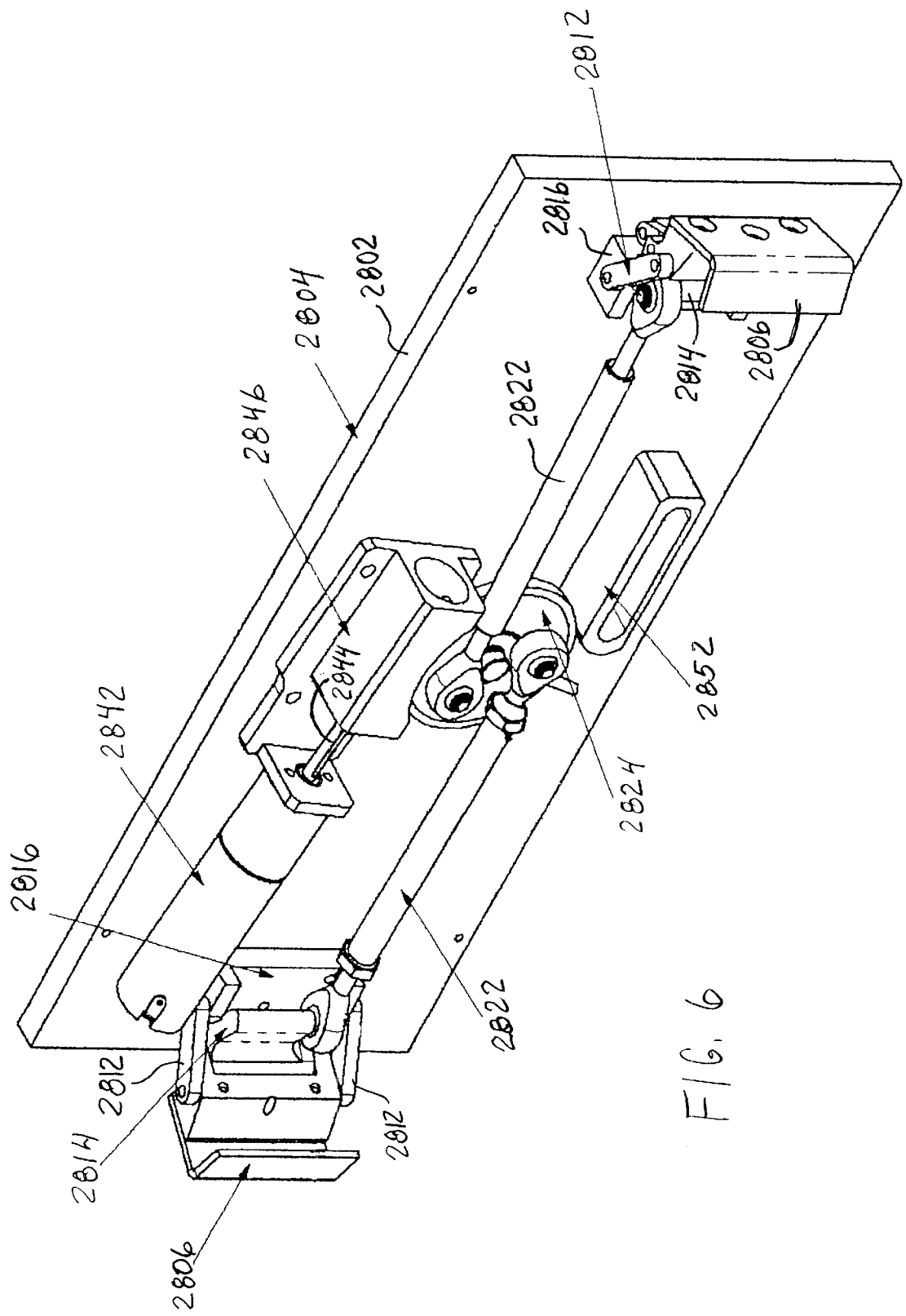
FIG. 6 is an exposed, perspective view of a gripper included in an end effector in accordance with the present invention that is adapted for use in the pod loader interface.

FIG. 6 depicts an embodiment of a gripper 2802 in accordance with the present invention that is preferably used in the end effector 28. The gripper 2802 includes a gripper mounting plate 2804 to opposite ends of which are coupled a pair of L-shaped gripper blades 2806. Pivoting joints couple each of the gripper blades 2806, a pair of side links 2812, a center actuation link 2814, and a linkage mounting block 2816 into a well known four-bar linkage structure. Each of the linkage mounting blocks 2816, which are securely fastened to the gripper mounting plate 2804, are oriented to establish rotationally symmetric four-bar linkage structures at opposite ends of the gripper mounting plate 2804. A pair of ball-end push rods 2822 respectively couple each of the center actuation links 2814 to a centrally located worm drive wheel 2824.

Figure 7A:
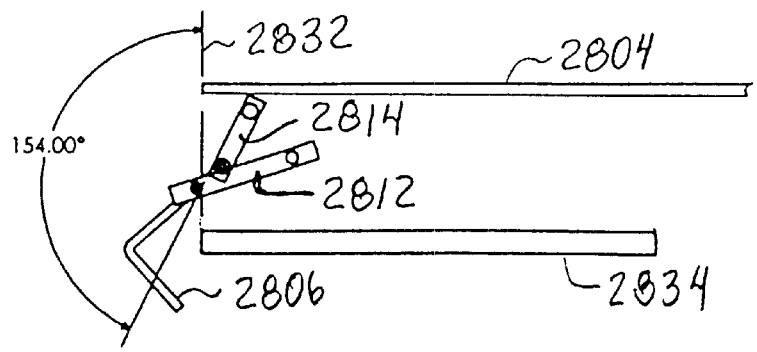
FIGS. 7A–7D are side elevational views which schematically illustrate movement of a gripper blade included in the gripper E depicted in FIG. 6.
Figure 7B:
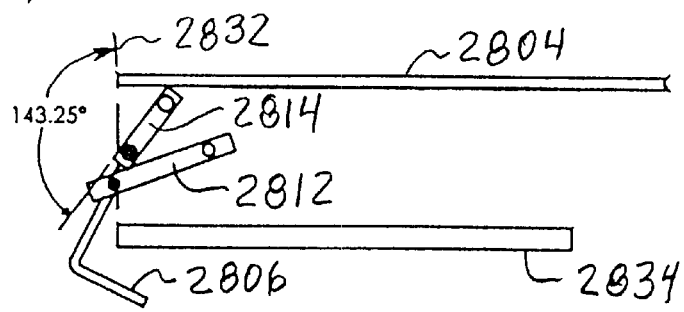

From an initial orientation of the worm drive wheel 2824 illustrated in FIG. 6, clockwise rotation of the worm drive wheel 2824 drives the push rods 2822 in opposite directions outward toward the respective linkage mounting blocks 2816. A theoretical analysis depicted in FIGS. 7A–7D schematically illustrates movement of one of the gripper blades 2806 with respect to the gripper mounting plate 2804 as the four-bar linkage pivots in response to clockwise rotation of the worm drive wheel 2824. Before the worm drive wheel 2824 begins rotating, as illustrated in FIG. 7A the center actuation link 2814 is oriented an at angle of approximately 1540 with respect to an axis 2832 that is perpendicular to the gripper mounting plate 2804. As the push rods 2822 are initially driven outward by rotation of the worm drive wheel 2824, the center actuation link 2814 pivots from its initial orientation depicted in FIG. 7A to a position depicted in FIG. 7C in which the center actuation link 2814 is oriented at an angle of approximately 132.5° with respect to the axis 2832. As indicated graphically in FIGS. 7A–7C, this initial movement of the center actuation link 2814 causes the gripper blades 2806, respectively located at opposite ends of the gripper mounting plate 2804, to pivot closer to each other, and toward a wafer carrier 24 if it were located between the gripper blades 2806.

Figure 7C:
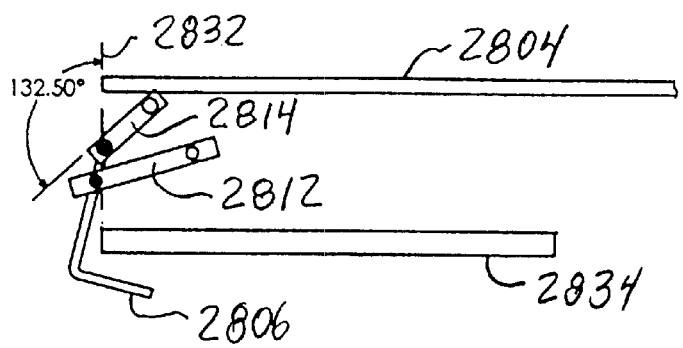
Figure 7D:
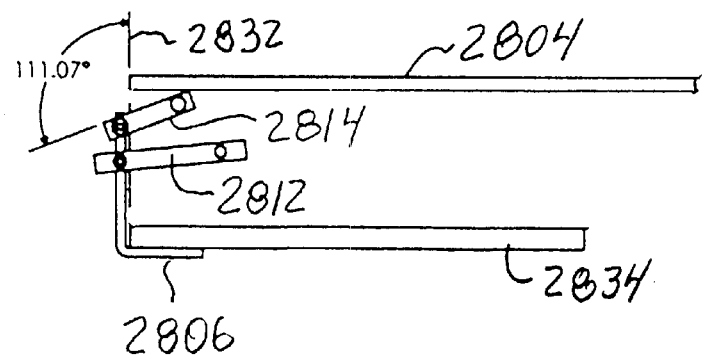

From the position illustrated in FIG. 7C, continued clockwise rotation of the worm drive wheel 2824 moves each center actuation link 2814 to the position illustrated in FIG. 7D in which the center actuation link 2814 is oriented at an angle of approximately 111.070 with respect to the axis 2832. This further movement of the center actuation link 2814 from the orientation illustrated in FIG. 7C to that illustrated in FIG. 7D causes the gripper blade 2806 to draw nearer to the gripper mounting plate 2804. If a wafer carrier 24 were located between the gripper blades 2806, this final movement of the gripper blades 2806 toward the gripper mounting plate 2804, causes them to engage a flange of the wafer carrier 24, graphically illustrated in FIGS. 7A–7D by a rectangle 2834.

Referring again to FIG. 6, the gripper 2802 also includes a bi-directional electric motor 2842 that is secured to the gripper mounting plate 2804. A shaft 2844 of the electric motor 2842 is coupled to a driving worm that is supported on bearings within a worm drive mounting-block 2846. Operation of the electric motor 2842 indirectly energizes movement of the gripper blades 2806 through rotation of the worm drive wheel 2824 which extends outward and retracts inward the push rods 2822.

The gripper 2802 also includes a optical worm-drive-wheel orientation-sensor 2852 to permit sensing when the gripper blades 2806 are properly positioned to engage a wafer carrier 24 as illustrated in FIG. 7D. When the worm drive wheel 2824 is in a pre-established orientation in which the gripper blades 2806 properly engage a wafer carrier 24, a shutter that projects radially outward from the worm drive wheel 2824, not illustrated in any of the FIGS., interrupts two (2) light beams which propagate within the orientation-sensor 2852. If something halts movement of the gripper blades 2806 before the worm drive wheel 2824 rotates to the pre-established orientation, or if the worm drive wheel 2824 rotates into an orientation beyond the pre-established orientation, then electrical signals from the orientation-sensor 2852 indicate that the gripper 2802 is not properly engaging the wafer carrier 24.

To impede contamination of wafers present in a wafer carrier 24 held by the gripper 2802, the preferred end effector 28 houses everything depicted in FIG. 6 except ends of the L-shaped gripper blades 2806 within an enclosure that is not illustrated in any of the FIGS. A surface of this enclosure located between the gripper blades 2806 carries the aligning means 284 depicted in FIG. 5. The preferred end effector 28 also includes a pair of micro-switches, not illustrated in any of the FIGS., that are spaced apart on the enclosure for detecting initial engagement of the end effector 28 with a wafer carrier 24.

Figure 8A:
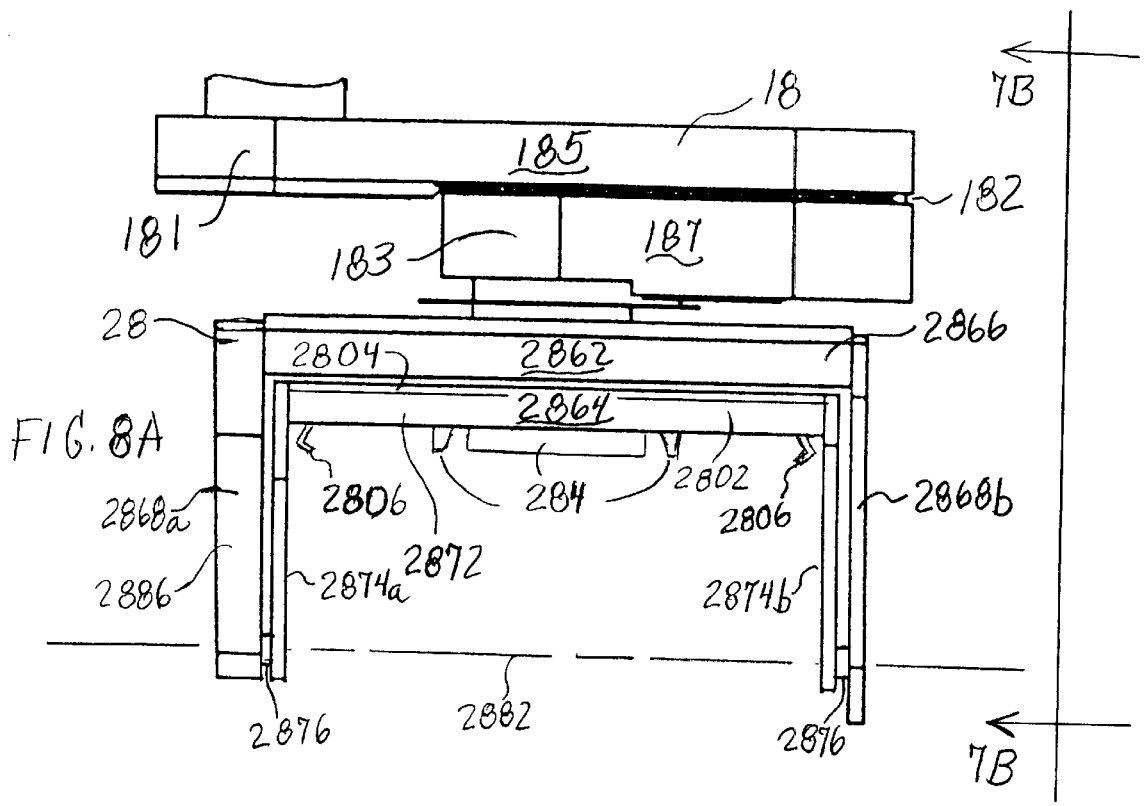
FIGS. 8A and 8B are respectively side and end elevational views illustrates U-shaped yokes that permit rotating a wafer carrier about an axis that is parallel to semiconductor wafers held therein.
Figure 8B:
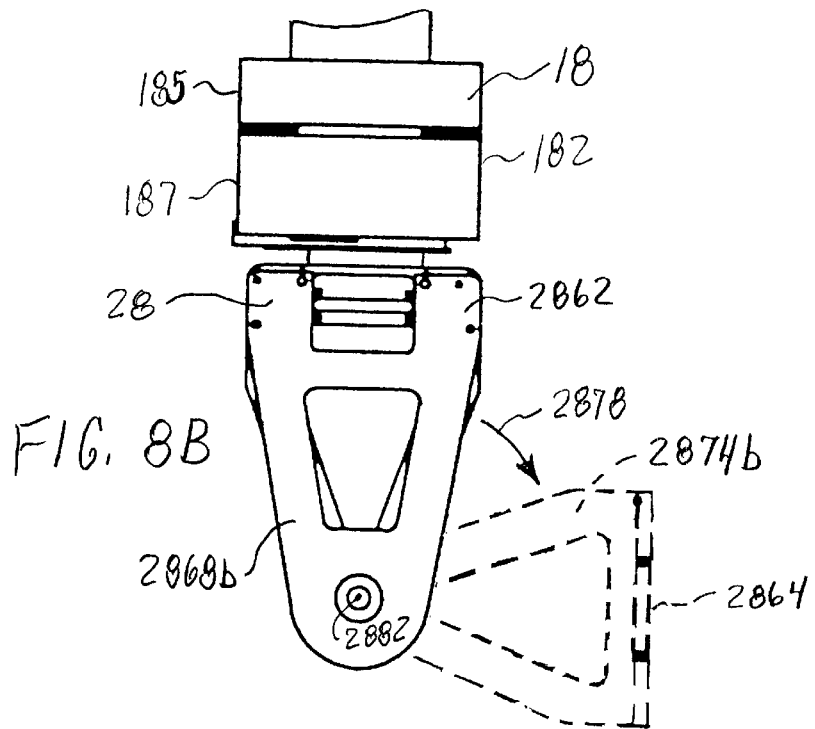

Because movement of the gripper blades 2806 toward the gripper mounting plate 2804 as illustrated in FIGS. 7C and 7D permits the gripper 2802 to more readily accommodate varying positions for the wafer carrier 24 present in a semiconductor processing tool, the gripper 2802 may attach directly to the wrist joint 183 of the arm 18 omitting the leaf spring assembly 282. However, to permit re-orienting semiconductor wafers held in the wafer carrier 24 while they are being transferred between the pod loader interface 10 and the processing tool, as illustrated in FIGS. 8A and 8B the end effector 28 may also include a U-shaped outer yoke 2862 within which nests a U-shaped inner yoke 2864. The outer yoke 2862 includes a base 2866 from opposite ends of which extend two parallel sides 2868a and 2868b. The base 2866 of the outer yoke 2862 attaches directly to the wrist joint 183 of the arm 18. The inner yoke 2864 also includes a base 2872 from opposite ends of which extend two parallel sides 2874a and 2874b. The gripper 2802 including the gripper mounting plate 2804 are incorporated into the base 2872 of the inner yoke 2864 between the sides 2874a and 2874b. Thus the outer yoke 2862 and the inner yoke 2864 attach the gripper 2802 to the arm 18.

The outer yoke 2862 and the inner yoke 2864 are joined to each other by rotational joints 2876 that are located between ends of sides 2868a and 2868b and sides 2874a and 2874b that are furthest from the base 2866 and the base 2872. As indicated by a curved arrow 2878 in FIG. 8B and the phantom illustration of the inner yoke 2864, the rotational joints 2876 permit relative rotation of the inner yoke 2864 with respect to the outer yoke 2862 about an axis 2882 that:

1. passes through the rotational joints 2876; and
2. is oriented parallel to semiconductor wafers carried in a wafer carrier 24 held by the gripper 2802.

A yoke rotary-drive 2886, that includes an electric motor located in the base 2866 and a transmission located in the side 2868a, is coupled between the outer yoke 2862 and the inner yoke 2864 to energize rotation of the inner yoke 2864 with respect to the outer yoke 2862.

In addition to reorienting wafers held in the wafer carrier 24, rotation of the inner yoke 2864 with respect to the outer yoke 2862 about an axis 2882 that is oriented parallel to semiconductor wafers held in a wafer carrier 24 may be exploited advantageously to reduce the possibility that wafers might fall out of the wafer carrier 24 during horizontal motion, or "rattle", in the wafer carrier 24 during vertical motion. Furthermore, appropriately tilting the wafer carrier 24 to an angle that exceeds 20° from the horizontal re-seats wafers in the wafer carrier 24 thus forestalling the possibility of damage while the cover 202 closes onto the base 201 of the SMIF pod 20.

Figure 9:
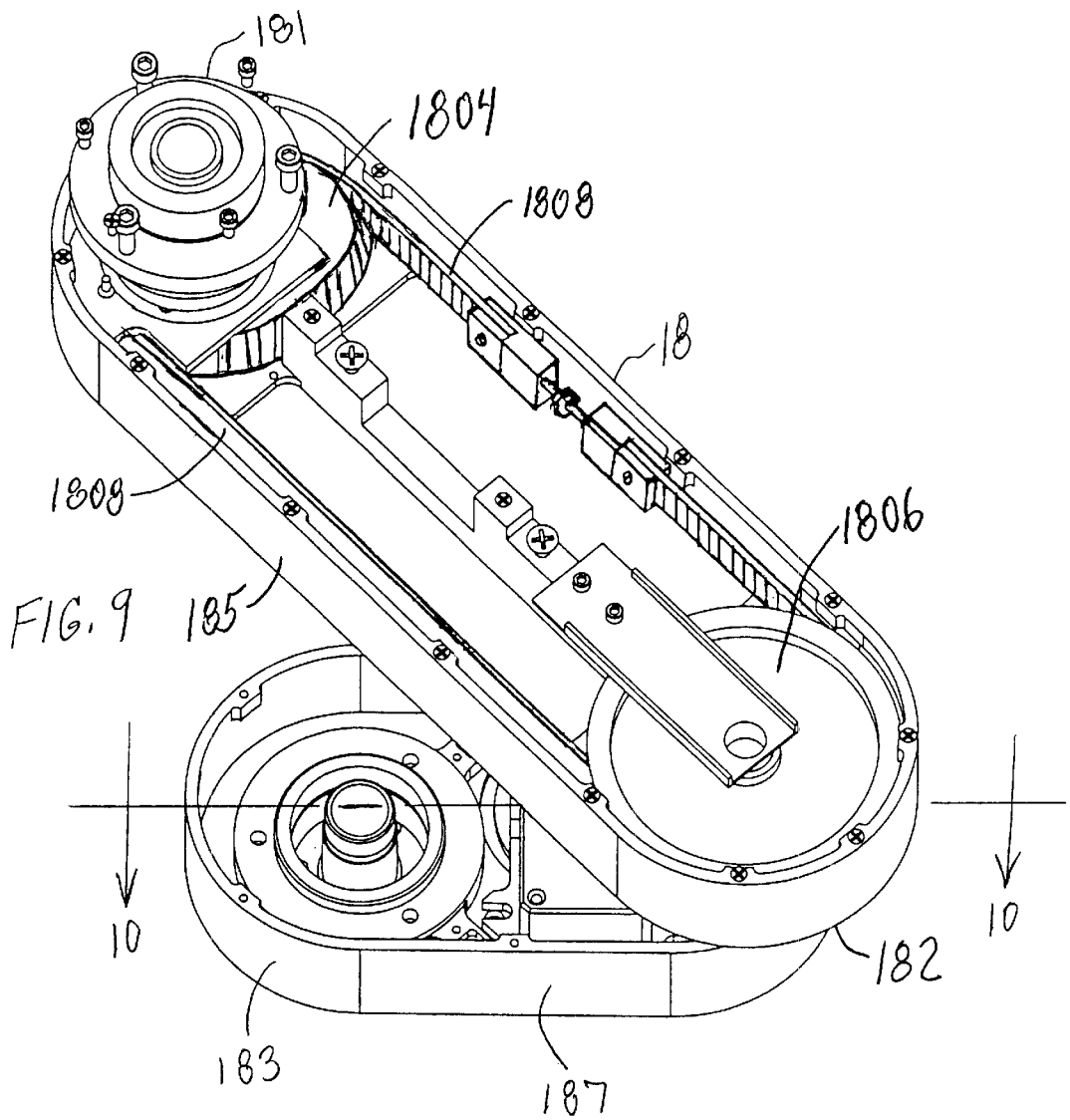
FIG. 9 is a cutaway perspective view depicting a portion of an articulated arm in accordance with the present invention.

FIG. 9 illustrates a presently preferred embodiment for a forearm rotary drive that is enclosed within the upper arm 185 of the arm 18. The forearm rotary drive includes a shoulder pulley 1804 that is located within the upper arm 185 and fixed through the shoulder joint 181 to the bulkhead 12. The forearm rotary drive also includes an elbow pulley 1806 that is also located within the upper arm 185 and fixed through the wrist joint 183 to the forearm 187. A toothed timing belt 1808, also located within the upper arm 185, couples the shoulder pulley 1804 and the elbow pulley 1806 to each other. Tension is applied to the toothed timing belt 1808 and its ends are coupled together by a differential screw 1812 which mates with and engages belt clamps 1814 that are respectively secured to each end of the toothed timing belt 1808.

The following equation expresses the deviation from straight line motion for the wrist joint 183 of the arm 18 which may be obtained as the upper arm 185 rotates with respect to the bulkhead 12 as depicted in FIGS. 10A–10C.

$$\text{Deviation} = L1 \cdot \cos(\theta) - L2 \cdot \cos\left[\theta \cdot \left(\frac{R}{r} - 1\right)\right] - (L1 - L2)$$

Where:
θ=angular rotation in radians of the upper arm 185 with respect to the bulkhead 12.
L1=length of the upper arm 185, 9.35 in.
L2=length of the forearm 187, 4.67 in.
R=radius of the shoulder pulley 1804 or the number of teeth on the shoulder pulley 1804, 54 teeth.
r=radius of the elbow pulley 1806 or the number of teeth on the elbow pulley 1806, 22 teeth.

FIG. 11, which graphically illustrates the difference between the preceding expression and straight line motion, indicates that the wrist joint 183 deviates less than 0.040 inches from straight line motion throughout the entire motion of the arm 18 on either side of the bulkhead 12 since, as illustrated in FIG. 10c, θ is usually less than 0.8 radians.

Figure 12:
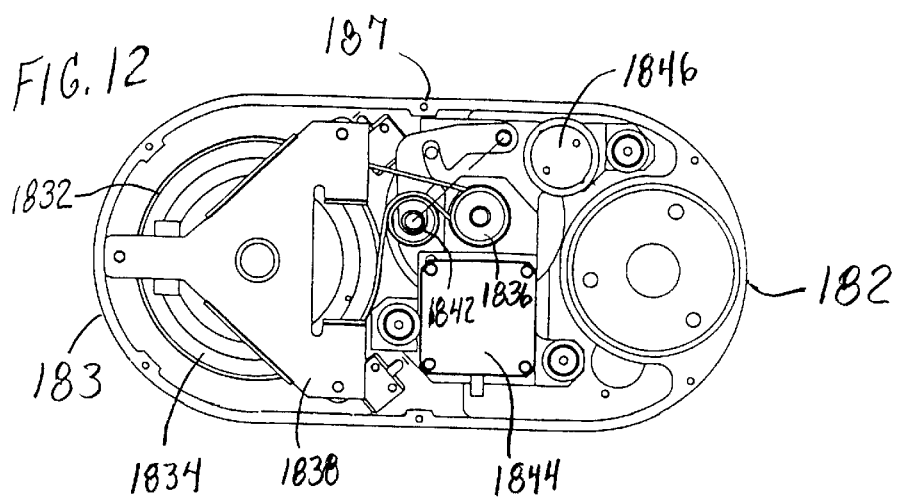
FIG. 12 is a cutaway perspective view depicting a portion of a forearm included in the articulated arm taken along the line 10—10 in FIG. 9.

Referring now to FIG. 12, the forearm 187 of the arm 18 includes an end effector rotary-drive which is coupled through the wrist joint 183 either directly, or indirectly through the outer yoke 2862 and the inner yoke 2864, to the gripper mounting plate 2804. The end effector rotary-drive includes a continuous, toothed belt 1832 which encircles a large diameter driven pulley 1834 and a smaller diameter driving pulley 1836. FIG. 12 also depicts a wire guide 1838 that is juxtaposed with one side of the driven pulley 1834 to protect electrical wires which pass through the wrist joint 183 to the end effector 28. Arranged this way, the driven pulley 1834 can be energized to rotate the end effector 28 about an axis that is oriented perpendicular to a plane in which the wrist joint 183 moves when the arm 18 transports semiconductor wafers held in the wafer carrier 24.

An adjustable idler wheel 1842 maintains tension in the belt 1832. Rotation of the driving pulley 1836 to drive the driven pulley 1834 is energized by a stepper motor 1844 which is coupled to the driving pulley 1836 through a reduction gear drive. The end effector rotary-drive also includes an encoder 1846 also driven by the reduction gear drive to sense rotation of the end effector 28 with respect to the forearm 187 which may be as much as ±200° with respect to a home position. The ability to rotate the about an axis that is oriented perpendicular to a plane in which the wrist joint 183 moves may be exploited advantageous in gripping a wafer carrier 24 that may be slightly mispositioned within the processing tool and/or pod loader interface.

The pod loader interface also includes an integrated air flow system to provide filtered air to maintain a clean mini-environment. Components of the air flow system 30 for a prior configuration of the pod loader interface 10 are depicted in FIG. 3. In that prior configuration, a fan installed in a fan housing 301 draws air in from the surrounding atmosphere. The air flows upward through a manifold 302. The manifold feeds the air into a filter contained in the filter housing 303 to remove any particulate matter. The air then flows upward through a plenum chamber 304 contained in the housing of the loading platform 16. The air then flows outward horizontally through a membrane contained in an inner wall of the plenum chamber 304, so that it flows across the surface of the wafers. A presently preferred configuration for the air flow system 30 is described in U.S. Pat. No. 5,934,991 entitled "Pod Loader Interface Improved Clean Air System" that issued Aug. 10, 1999, and that is hereby incorporated by reference. A uniform velocity horizontal air flow across the surfaces of the wafers provided by the preferred air flow system 30 allows the present invention to maintain wafers in a cleaner environment than that provided by other pod loader interfaces.

Operation of the pod loader interface 10 to load and unload a wafer carrier is as follows: An operator places a SMIF pod 20 containing a wafer carrier 24 on the loading platform 16. (The loading platform 16 is contained in a mini-environment to maintain cleanroom conditions.) The machine is activated, and the pod 20 is unlocked. The elevator 14 secures the clamps 141 on the cover 202 of the SMIF pod 20. The elevator 14 raises to its highest position, as shown in FIG. 3, lifting the cover 202 away from the wafer carrier 24.

The articulated arm 18 is then moved into position over the wafer carrier 24. The gripping means 281 of the end effector 28 retract, thus securing the wafer carrier 24 to the end effector 28. The arm 18 then lifts the wafer carrier 24 from the loading platform 16, and places it into the proper position for the desired process operation.

After the manufacturing process operation is completed, the pod loader interface process reverses to re-load the wafer carrier 24 back into the SMIF pod 20 for transport to the next desired location.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. An end effector gripper adapted for attachment to an articulated arm as part of an end effector which is includable in a pod loader interface, the end effector gripper adapting the pod loader interface for gripping a wafer carrier enclosable within a Standard Mechanical InterFace ("SMIF") pod and for transporting to a process operation semiconductor wafers held in the wafer carrier, and for subsequently reloading the semiconductor wafers and the wafer carrier into the SMIF pod when the process operation is completed, the end effector gripper comprising:

a gripper mounting plate that is adapted for attachment to the articulated arm;

aligning means, secured to said gripper mounting plate, which adapt the end effector gripper for properly aligning with the wafer carrier;

a pair of gripper blades that are separated from each other along and are coupled to said gripper mounting plate, and which during gripping of the wafer carrier by the end effector gripper initially close toward each other and then draw nearer to said gripper mounting plate; and drive means, also secured to said gripper mounting plate, which energize movement of the gripper blades for gripping the wafer carrier.

2. The end effector gripper of claim 1 wherein said aligning means includes multiple blocks disposed about a central area of a side of the gripper mounting plate which approaches nearest to the wafer carrier, each of the multiple blocks including a tapered inner side surface thereby adapting the multiple blocks for cooperatively guiding a handle of the wafer carrier to a centered position with respect to the gripper mounting plate when the gripper mounting plate approaches nearest to the wafer carrier.

3. The end effector gripper of claim 1 wherein each of said gripper blades is pivotally coupled to said gripper mounting plate.

4. The end effector gripper of claim 3 wherein inclusion of each gripper blade in a four-bar linkage effects pivotal coupling of said gripper blade to said gripper mounting plate.

5. The end effector gripper of claim 3 wherein each gripper blade is L-shaped.

6. The end effector gripper of claim 1 wherein said drive means includes a pair of push-rods each of which is coupled at a first end respectively to one of said gripper blades, and each of which has a second end that is located between said gripper blades, movement of the second ends of the two push-rods in opposite directions effecting closure of said gripper blades during griping the wafer carrier.

7. The end effector gripper of claim 1 wherein said gripper mounting plate attaches directly to the articulated arm.

8. The end effector gripper of claim 1 further comprising:

an outer and an inner nested pair of U-shaped yokes included in the end effector gripper attach said gripper mounting plate to the articulated arm, each of the U-shaped yokes having a base from opposite ends of which extend two parallel sides, the base of the outer U-shaped yoke attaching directly to the articulated arm, the outer and inner U-shaped yokes being joined to each other by rotational joints that are located between ends of each of the sides that are distal from the bases thereof to permit relative rotation of the U-shaped yokes with respect to each other, said gripper mounting plate being incorporated into the base of the inner U-shaped yoke between the sides thereof; and a yoke rotary-drive coupled between and energizing rotation of the outer and inner U-shaped yokes with respect to each other, whereby the end effector gripper may rotate a wafer carrier that is gripped by the gripper blades about an axis that:

passes through the rotational joints between ends of the sides of the U-shaped yokes; and is oriented parallel to semiconductor wafers held in the wafer carrier.

9. An articulated arm adapted for inclusion in a pod loader interface that adapts the pod loader interface for gripping a wafer carrier enclosable within a SMIF pod and for transporting to a process operation semiconductor wafers held in the wafer carrier, and for subsequently reloading the semiconductor wafers and the wafer carrier into the SMIF pod when the process operation is completed, the articulated arm comprising:

a pivoting shoulder joint that is adapted to be secured to a bulkhead of the pod loader interface;

an upper arm that extends away from said shoulder joint;

a pivoting elbow joint that is located at an end of the upper arm distal from said shoulder joint;

a forearm that is pivotally coupled to said upper arm by said elbow joint and that extends away from said shoulder joint; and a pivoting wrist joint that is located at an end of the forearm distal from said elbow joint; and an end effector that includes:

an end effector gripper that is attached to said articulated arm and which includes:

a gripper mounting plate that is attached to the wrist joint of the articulated arm;

aligning means, secured to said gripper mounting plate, which adapt the end effector gripper for properly aligning with the wafer carrier;

a pair of gripper blades that are separated from each other along and are coupled to said gripper mounting plate, and which during gripping of the wafer carrier by the end effector gripper initially close toward each other and then draw nearer to said gripper mounting plate; and drive means, also secured to said gripper mounting plate, which energize movement of the gripper blades for gripping the wafer carrier.

10. The end effector gripper of the articulated arm of claim 9 wherein said aligning means includes multiple blocks disposed about a central area of a side of the gripper mounting plate which approaches nearest to the wafer carrier, each of the multiple blocks including a tapered inner side surface thereby adapting the multiple blocks for cooperatively guiding a handle of the wafer carrier to a centered position with respect to the gripper mounting plate when the gripper mounting plate approaches nearest to the wafer carrier.

11. The end effector gripper of the articulated arm of claim 9 wherein each of said gripper blades is pivotally coupled to said gripper mounting plate.

12. The end effector gripper of the articulated arm of claim 11 wherein inclusion of each gripper blade in a four-bar linkage effects pivotal coupling of said gripper blade to said gripper mounting plate.

13. The end effector gripper of the articulated arm of claim 11 wherein each gripper blade is L-shaped.

14. The end effector gripper of the articulated arm of claim 9 wherein said drive means includes a pair of push-rods each of which is coupled at a first end respectively to one of said gripper blades, and each of which has a second end that is located between said gripper blades, movement of the second ends of the two push-rods in opposite directions effecting closure of said gripper blades during griping the wafer carrier.

15. The end effector gripper of the articulated arm of claim 9 wherein said gripper mounting plate attaches directly to the wrist joint of the articulated arm.

16. The end effector gripper of the articulated arm of claim 9 further comprising:
   an outer and an inner nested pair of U-shaped yokes included in the end effector gripper attach said gripper mounting plate to the articulated arm, each of the U-shaped yokes having a base from opposite ends of which extend two parallel sides, the base of the outer U-shaped yoke attaching directly to the articulated arm, the outer and inner U-shaped yokes being joined to each other by rotational joints that are located between ends of each of the sides that are distal from the bases thereof to permit relative rotation of the U-shaped yokes with respect to each other, said gripper mounting plate being incorporated into the base of the inner U-shaped yoke between the sides thereof; and
   a yoke rotary-drive coupled between and energizing rotation of the outer and inner U-shaped yokes with respect to each other,
   whereby the end effector gripper may rotate a wafer carrier that is gripped by the gripper blades about an axis that:
      passes through the rotational joints between ends of the sides of the U-shaped yokes; and
      is oriented parallel to semiconductor wafers held in the wafer carrier.

17. The articulated arm of claim 9 wherein said upper arm and said forearm have unequal lengths.

18. The articulated arm of claim 17 wherein said upper arm includes:
   a shoulder pulley that is located within said upper arm and fixed through said shoulder joint to the bulkhead;
   an elbow pulley that is also located within said upper arm and fixed through said elbow joint to said forearm; and
   a notched timing belt that is also located within said upper arm and that couples the pulleys to each other, respective diameters of said pulleys and lengths of said upper arm and forearm being arranged so rotation of said upper arm about said shoulder joint effects substantially straight line motion of said wrist joint during transportation of the wafer carrier to the process operation, and subsequent reloading of the wafer carrier into the SMIF pod when the process operation is completed.

19. The articulated arm of claim 18 wherein a differential screw couples together ends of and tenses the notched timing belt.

20. The articulated arm of claim 9 wherein said upper arm is longer than said forearm.

21. The articulated arm of claim 20 wherein said upper arm includes:
   a shoulder pulley that is located within said upper arm and fixed through said shoulder joint to the bulkhead;
   an elbow pulley that is also located within said upper arm and fixed through said elbow joint to said forearm; and
   a notched timing belt that is also located within said upper arm and that couples the pulleys to each other, respective diameters of said pulleys and lengths of said upper arm and forearm being arranged so rotation of said upper arm about said shoulder joint effects substantially straight line motion of said wrist joint during transportation of the wafer carrier to the process operation, and subsequent reloading of the wafer carrier into the SMIF pod when the process operation is completed.

22. The articulated arm of claim 21 wherein a differential screw couples together ends of and tenses the notched timing belt.

23. The articulated arm of claim 9 wherein said forearm includes an end effector rotary-drive which is coupled through said wrist joint to said gripper mounting plate of said end effector gripper for independently rotating said end effector with respect to said forearm about an axis that is oriented perpendicular to a plane in which said wrist joint moves when the articulated arm transports semiconductor wafers held in the wafer carrier.

24. The end effector gripper of the articulated arm of claim 23 wherein said gripper mounting plate attaches to the wrist joint of the articulated arm, and said end effector rotary-drive directly rotates the gripper mounting plate.

25. The end effector gripper of the articulated arm of claim 23 further comprising:
   an outer and an inner nested pair of U-shaped yokes included in the end effector gripper attach said gripper mounting plate to the articulated arm, each of the U-shaped yokes having a base from opposite ends of which extend two parallel sides, the base of the outer U-shaped yoke attaching directly to the wrist joint of the articulated arm and said end effector rotary-drive directly rotating the outer U-shaped yoke, the outer and inner U-shaped yokes being joined to each other by rotational joints that are located between ends of each of the sides that are distal from the bases thereof to permit relative rotation of the U-shaped yokes with respect to each other, said gripper mounting plate being incorporated into the base of the inner U-shaped yoke between the sides thereof; and
   a yoke rotary-drive coupled between and energizing rotation of the outer and inner U-shaped yokes with respect to each other, whereby the end effector gripper may rotate a wafer carrier that is gripped by the gripper blades about an axis that:
      passes through the rotational joints between ends of the sides of the U-shaped yokes; and
      is oriented parallel to semiconductor wafers held in the wafer carrier.

26. A pod loader interface that is adapted for unloading and reloading a SMIF pod that includes:
   a wafer carrier adapted to receive a plurality of semiconductor wafers;
   a pod base that is adapted to receive the wafer carrier; and
   a pod cover which mates with and seals to the pod base thereby enclosing within the SMIF pod the wafer carrier and semiconductor wafers received therein;
   the pod loader interface being adapted for gripping the wafer carrier and for transporting semiconductor wafers held in the wafer carrier; the pod loader interface comprising:
a main bulkhead having an opening formed therethrough;
a loading platform supported on said bulkhead, said loading platform being adapted for receiving the pod base of the SMIF pod, and for unlocking the pod cover from the pod base;
an elevator supported on said bulkhead, said elevator being adapted for lifting the pod cover upward above the pod base to thereby expose the wafer carrier of the SMIF pod;
an articulated arm supported on said bulkhead that includes:
a pivoting shoulder joint that is adapted to be secured to said bulkhead of the pod loader interface; an upper arm that extends away from said shoulder joint;
a pivoting elbow joint that is located at an end of the upper arm distal from said shoulder joint;
a forearm that is pivotally coupled to said upper arm by said elbow joint and that extends away from said shoulder joint; and
a pivoting wrist joint that is located at an end of the forearm distal from said elbow joint;
said articulated arm being adapted for transporting the wafer carrier and semiconductor wafers held in the wafer carrier through the opening in said bulkhead; and
an end effector that includes:
an end effector gripper that is attached to said articulated arm and which includes:
a gripper mounting plate that is attached to the wrist joint of the articulated arm;
aligning means, secured to said gripper mounting plate, which adapt the end effector gripper for properly aligning with the wafer carrier;
a pair of gripper blades that are separated from each other along and are coupled to said gripper mounting plate, and which during gripping of the wafer carrier by the end effector gripper initially close toward each other and then draw nearer to said gripper mounting plate; and
drive means, also secured to said gripper mounting plate, which energize movement of the gripper blades for gripping the wafer carrier.

27. The end effector gripper of the pod loader interface of claim 26 wherein said aligning means includes multiple blocks disposed about a central area of a side of the gripper mounting plate which approaches nearest to the wafer carrier, each of the multiple blocks including a tapered inner side surface thereby adapting the multiple blocks for cooperatively guiding a handle of the wafer carrier to a centered position with respect to the gripper mounting plate when the gripper mounting plate approaches nearest to the wafer carrier.

28. The end effector gripper of the pod loader interface of claim 26 wherein each of said gripper blades is pivotally coupled to said gripper mounting plate.

29. The end effector gripper of the pod loader interface of claim 28 wherein inclusion of each gripper blade in a four-bar linkage effects pivotal coupling of said gripper blade to said gripper mounting plate.

30. The end effector gripper of the pod loader interface of claim 28 wherein each gripper blade is L-shaped.

31. The end effector gripper of the pod loader interface of claim 26 wherein said drive means includes a pair of push-rods each of which is coupled at a first end respectively to one of said gripper blades, and each of which has a second end that is located between said gripper blades, movement of the second ends of the two push-rods in opposite directions effecting closure of said gripper blades during griping the wafer carrier.

32. The end effector gripper of the pod loader interface of claim 26 wherein said gripper mounting plate attaches directly to the wrist joint of the articulated arm.

33. The end effector gripper of the pod loader interface of claim 26 further comprising:
an outer and an inner nested pair of U-shaped yokes included in the end effector gripper attach said gripper mounting plate to the articulated arm, each of the U-shaped yokes having a base from opposite ends of which extend two parallel sides, the base of the outer U-shaped yoke attaching directly to the articulated arm, the outer and inner U-shaped yokes being joined to each other by rotational joints that are located between ends of each of the sides that are distal from the bases thereof to permit relative rotation of the U-shaped yokes with respect to each other, said gripper mounting plate being incorporated into the base of the inner U-shaped yoke between the sides thereof; and
a yoke rotary-drive coupled between and energizing rotation of the outer and inner U-shaped yokes with respect to each other,
whereby the end effector gripper may rotate a wafer carrier that is gripped by the gripper blades about an axis that:
passes through the rotational joints between ends of the sides of the U-shaped yokes; and
is oriented parallel to semiconductor wafers held in the wafer carrier.

34. The articulated arm of the pod loader interface of claim 26 wherein said upper arm is longer than said forearm.

35. The articulated arm of the pod loader interface of claim 34 wherein said upper arm includes:
a shoulder pulley that is located within said upper arm and fixed through said shoulder joint to the bulkhead;
an elbow pulley that is also located within said upper arm and fixed through said elbow joint to said forearm; and
a notched timing belt that is also located within said upper arm and that couples the pulleys to each other, respective diameters of said pulleys and lengths of said upper arm and forearm being arranged so rotation of said upper arm about said shoulder joint effects substantially straight line motion of said wrist joint during transportation of the wafer carrier to the process operation, and subsequent reloading of the wafer carrier into the SMIF pod when the process operation is completed.

36. The articulated arm of the pod loader interface of claim 35 wherein a differential screw couples together ends of and tenses the notched timing belt.

37. The articulated arm of the pod loader interface of claim 26 wherein said forearm includes an end effector rotary-drive which is coupled through said wrist joint to said gripper mounting plate of said end effector gripper for independently rotating said end effector with respect to said forearm about an axis that is oriented perpendicular to a plane in which said wrist joint moves when the articulated arm transports semiconductor wafers held in the wafer carrier.

38. The end effector gripper of the pod loader interface of claim 37 wherein said gripper mounting plate attaches to the wrist joint of the articulated arm, and said end effector rotary-drive directly rotates the gripper mounting plate.

39. The end effector gripper of the pod loader interface of claim 37 further comprising:

an outer and an inner nested pair of U-shaped yokes included in the end effector gripper attach said gripper mounting plate to the articulated arm, each of the U-shaped yokes having a base from opposite ends of which extend two parallel sides, the base of the outer U-shaped yoke attaching directly to the wrist joint of the articulated arm and said end effector rotary-drive directly rotating the outer U-shaped yoke, the outer and inner U-shaped yokes being joined to each other by rotational joints that are located between ends of each of the sides that are distal from the bases thereof to permit relative rotation of the U-shaped yokes with respect to each other, said gripper mounting plate being incorporated into the base of the inner U-shaped yoke between the sides thereof; and a yoke rotary-drive coupled between and energizing rotation of the outer and inner U-shaped yokes with respect to each other, whereby the end effector gripper may rotate a wafer carrier that is gripped by the gripper blades about an axis that:

passes through the rotational joints between ends of the sides of the U-shaped yokes; and is oriented parallel to semiconductor wafers held in the wafer carrier.

* * * * *